United States Patent
Choi et al.

(10) Patent No.: US 9,349,982 B2
(45) Date of Patent: May 24, 2016

(54) ORGANIC LIGHT-EMITTING DISPLAY DEVICE AND METHOD OF FABRICATING THE SAME

(71) Applicant: Samsung Display Co., Ltd., Yongin (KR)

(72) Inventors: Chaun Gi Choi, Yongin-si (KR); Hui Won Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/055,548

(22) Filed: Oct. 16, 2013

(65) Prior Publication Data

US 2014/0353606 A1   Dec. 4, 2014

(30) Foreign Application Priority Data

Jun. 4, 2013   (KR) .......................... 10-2013-0064122

(51) Int. Cl.
*H01L 51/52*   (2006.01)
*H01L 27/32*   (2006.01)

(52) U.S. Cl.
CPC ........ *H01L 51/5228* (2013.01); *H01L 51/5212* (2013.01); *H01L 27/3246* (2013.01)

(58) Field of Classification Search
CPC ............ H01L 51/0014; H01L 51/0015; H01L 51/0016; H01L 51/5212; H01L 51/5228
USPC .............................................. 257/40; 438/99
See application file for complete search history.

(56) References Cited

U.S. PATENT DOCUMENTS

| | | | | |
|---|---|---|---|---|
| 6,525,467 | B1 * | 2/2003 | Eida .................... | H01L 51/5212 313/504 |
| 8,928,011 | B2 * | 1/2015 | Tanada ................ | H01L 27/3204 257/347 |
| 9,111,892 | B2 * | 8/2015 | Nendai ............... | H01L 51/5228 |
| 2006/0113900 | A1 | 6/2006 | Oh | |
| 2009/0256168 | A1 * | 10/2009 | Taneda ................ | H01L 27/3246 257/98 |
| 2010/0084646 | A1 * | 4/2010 | Matsusue ............ | H01L 51/5203 257/40 |
| 2010/0127264 | A1 * | 5/2010 | Bang et al. ....................... | 257/59 |
| 2012/0161166 | A1 * | 6/2012 | Yamazaki ........................ | 257/88 |

FOREIGN PATENT DOCUMENTS

| | | |
|---|---|---|
| KR | 10-2005-0113517 | 12/2005 |
| KR | 10-0700643 | 3/2007 |
| KR | 10-0786294 | 12/2007 |
| KR | 10-2008-0051220 | 6/2008 |
| KR | 10-2011-0035049 | 4/2011 |

* cited by examiner

*Primary Examiner* — Fernando L Toledo
*Assistant Examiner* — Christine L Hagan
(74) *Attorney, Agent, or Firm* — H.C. Park & Associates, PLC

(57) ABSTRACT

The present invention relates to an organic light-emitting display device and a method of fabricating the same. The device may include a base substrate, a thin-film transistor disposed on the base substrate, an organic light-emitting device including a first electrode connected to the thin-film transistor, an organic pattern disposed on the first electrode, and a second electrode disposed on the organic pattern. The device further includes an auxiliary electrode including a connection part and a non-connection part, the connection part being connected to the second electrode. The width of the connection part may be less than that of the non-connection part, when measured in the direction perpendicular to a current flow.

13 Claims, 9 Drawing Sheets

ORGANIC LIGHT-EMITTING DISPLAY DEVICE AND METHOD OF FABRICATING THE SAME

CROSS REFERENCE TO RELATED APPLICATION

This application claims priority from and the benefit of Korean Patent Application No. 10-2013-0064122, filed on Jun. 4, 2013, which is hereby incorporated by reference for all purposes as if fully set forth herein.

BACKGROUND

1. Field

Exemplary embodiments of the present disclosure relate to an organic light-emitting display device configured to prevent a voltage drop from occurring and a method of fabricating the same.

2. Discussion of the Background

Conventionally, an organic light-emitting display device includes a thin-film transistor substrate, an opposite substrate, and a plurality of organic light-emitting devices disposed between the thin-film transistor substrate and the opposite substrate. In the organic light-emitting device, an organic layer is provided on an anode electrode, which may be partially exposed by a pixel defining layer, and a cathode electrode is provided on the organic layer. During an operation of the organic light-emitting device, holes and electrons are injected into the organic layer from the anode and cathode electrodes and recombined with each other to produce excitons. The excitons may fall from the excited state to the ground state, thereby emitting light having the same energy as a difference in energy between the excited and ground states.

If the cathode electrode is a thin metal layer, a voltage applied to the pixel may vary depending on its position. For example, due to a voltage drop, there is a difference in voltage between regions adjacent and distant to a voltage input node.

Such a voltage difference may lead to deterioration in light-emitting efficiency of the organic light-emitting device.

The above information disclosed in this background section is only for enhancement of understanding of the background of the disclosed subject matter and therefore may contain information that does not form any part of the prior art nor what the prior art may suggest to a person of ordinary skill in the art.

SUMMARY

Exemplary embodiments of the present disclosure provide an organic light-emitting display device configured to prevent a voltage drop from occurring.

Exemplary embodiments of the present disclosure also provide a method of fabricating the organic light-emitting display device.

Additional features of the present disclosure will be set forth in the description which follows, and in part will be apparent from the description, or may be learned by practice of the disclosed subject matter.

Exemplary embodiments of the present disclosure disclose an organic light-emitting display device including a base substrate, a thin-film transistor disposed on the base substrate, and an organic light-emitting device including a first electrode connected to the thin-film transistor, an organic pattern disposed on the first electrode, and a second electrode disposed on the organic pattern. The organic light-emitting display device further includes an auxiliary electrode including a connection part and a non-connection part. The connection part is connected to the second electrode. A width of the connection part is less than a width of the non-connection part.

Exemplary embodiments of the present disclosure also disclose an organic light-emitting display device including a base substrate, a thin-film transistor disposed on the base substrate, an organic light-emitting device including a first electrode connected to the thin-film transistor, an organic pattern disposed on the first electrode, and a second electrode disposed on the organic pattern. The organic light-emitting display device further includes an auxiliary electrode including a connection part and a non-connection part. The connection part is connected to the second electrode. The connection part and the non-connection part have different resistances from each other.

Exemplary embodiments of the present disclosure also disclose a method of fabricating an organic light-emitting display device. The method includes forming a thin-film transistor on a base substrate, forming a first electrode connected to the thin-film transistor and an auxiliary electrode spaced apart from the first electrode. The auxiliary electrode includes a connection part and a non-connection part. The method further includes forming a pixel defining layer exposing portions of the first electrode and portions of the connection part, forming an organic layer on the first electrode, the connection part, and the pixel defining layer; patterning the organic layer to form an organic pattern; and forming a second electrode on the organic pattern and the pixel defining layer. The forming of the organic pattern includes applying an electric power to the auxiliary electrode to produce heat from the connection part and removing a portion of the organic layer adjacent to the connection part using the heat.

It is to be understood that both the foregoing general description and the following detailed description are exemplary and explanatory and are intended to provide further explanation of the disclosed subject matter as claimed.

BRIEF DESCRIPTION OF THE DRAWINGS

The accompanying drawings, which are included to provide a further understanding of the disclosed subject matter and are incorporated in and constitute a part of this specification, illustrate embodiments of the disclosed subject matter, and together with the description serve to explain the principles of the disclosed subject matter.

DETAILED DESCRIPTION OF THE ILLUSTRATED EMBODIMENTS

Figure 1:
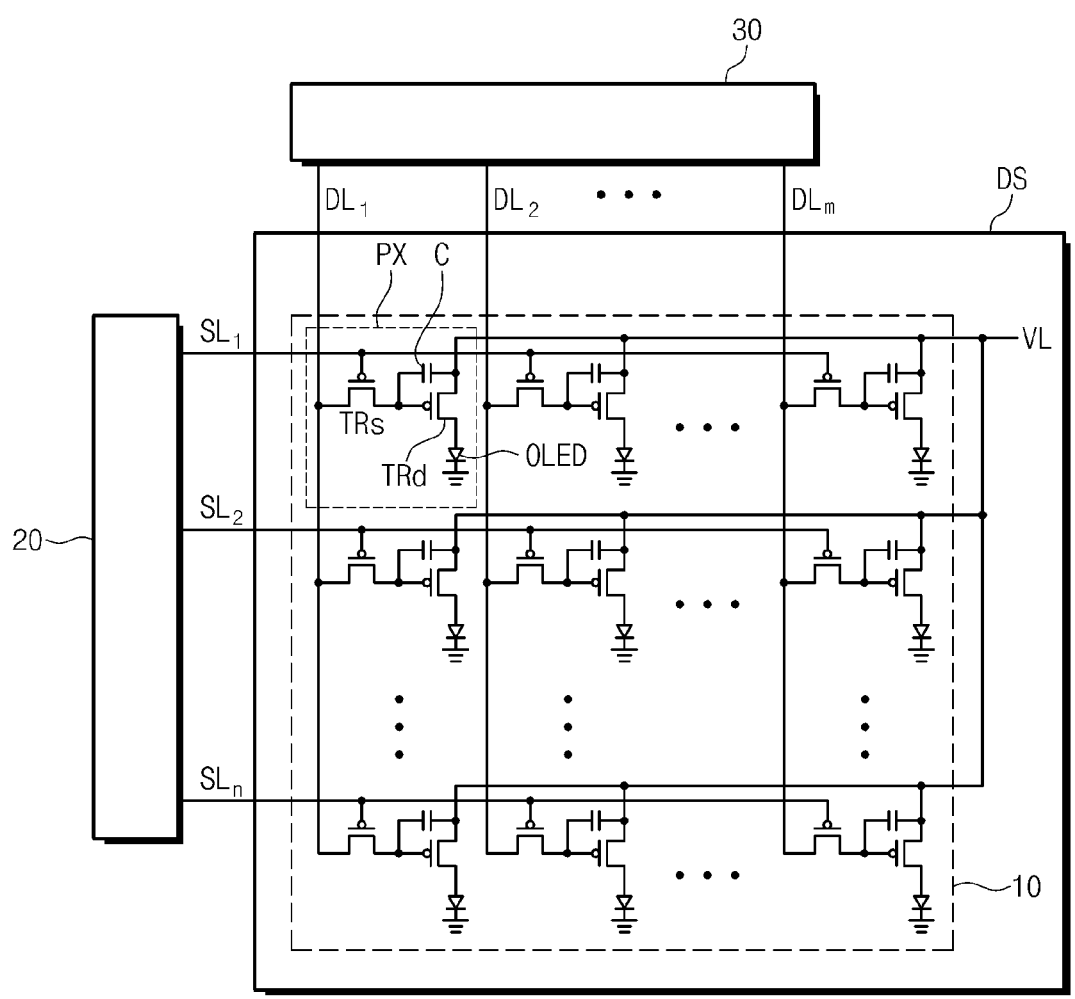
FIG. 1 is a schematic circuit diagram illustrating an organic light-emitting display device according to exemplary embodiments of the present disclosure.

Exemplary embodiments of the disclosed subject matter are described more fully hereinafter with reference to the accompanying drawings. The disclosed subject matter may, however, be embodied in many different forms and should not be construed as limited to the exemplary embodiments set forth herein. Rather, the exemplary embodiments are provided so that this disclosure is thorough and complete, and will convey the scope of the disclosed subject matter to those skilled in the art. In the drawings, the size and relative sizes of layers and regions may be exaggerated for clarity. Like reference numerals in the drawings denote like elements.

It will be understood that when an element or layer is referred to as being "on", "connected to", or "coupled to" another element or layer, it can be directly on, connected, or coupled to the other element or layer or intervening elements or layers may be present. In contrast, when an element is referred to as being "directly on", "directly connected to", or "directly coupled to" another element or layer, there are no intervening elements or layers present. As used herein, the term "and/or" includes any and all combinations of one or more of the associated listed items. It may also be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments of the present disclosure.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an", and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the disclosed subject matter are described herein with reference to cross-sectional illustrations that are schematic illustrations of idealized embodiments (and intermediate structures) of the disclosed subject matter. As such, variations from the shapes of the illustrations as a result, for example, of manufacturing techniques and/or tolerances, are to be expected. Thus, example embodiments of the disclosed subject matter should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, exemplary embodiments of the present disclosure will be described in detail with reference to the accompanying drawings.

FIG. 1 is a schematic circuit diagram illustrating an organic light-emitting display device according to exemplary embodiments of the present disclosure.

Referring to FIG. 1, an organic light emitting display device may include a display substrate DS with a display portion 10 configured to display an image, a scan driver 20, and a data driver 30.

The scan driver 20 and the data driver 30 may be electrically connected to the display portion 10 through signal lines including scan lines $SL_1$, $SL_2$, and $SL_n$, (n being any whole number greater than 1), data lines $DL_1$, $DL_2$, and $DL_m$, (m being any whole number greater than 1), and power supply lines VL.

For example, the scan driver 20 may be electrically connected to the display portion 10 through a plurality of the scan lines $SL_1$, $SL_2$, and $SL_n$. The scan driver 20 may be configured to send scan signals to the display portion 10 through the scan lines $SL_1$, $SL_2$, and $SL_n$, which may be provided on the display substrate DS to extend in a first direction.

The data driver 30 may be electrically connected to the data lines $DL_1$, $DL_2$, and $DL_m$. Accordingly, the data driver 30 may be electrically connected to the display portion 10 through a plurality of the data lines $DL_1$, $DL_2$, and $DL_m$. The data driver 30 may be configured to send data signals to the display portion 10 through the data lines $DL_1$, $DL_2$, and $DL_m$.

The data lines $DL_1$, $DL_2$, and $DL_m$ may extend along a different direction (e.g., a second direction) from the scan lines $SL_1$, $SL_2$, and $SL_n$. For example, the data lines $DL_1$, $DL_2$, and $DL_m$ may cross (e.g., may be perpendicular to) the scan lines $SL_1$, $SL_2$, and $SL_n$.

The power supply lines VL may apply an electric power to the display portion 10. The power supply lines VL may be disposed to cross the data lines $DL_1$, $DL_2$, and $DL_m$ and/or the scan lines $SL_1$, $SL_2$, and $SL_n$.

The display portion 10 may include a plurality of pixels PX. Each of the pixels PX may be electrically connected to the corresponding one of the data lines $DL_1$, $DL_2$, and $DL_m$, the corresponding one of the scan lines $SL_1$, $SL_2$, and $SL_n$, and the corresponding one of the power supply lines VL. Each of the pixels PX may include a switching thin film transistor TRs, a driving thin film transistor TRd, a capacitor C, and an organic light emitting device (OLED). The transistors TRs and TRd may function as switching elements that operate according to a data signal transmitted through the data lines $DL_1$, $DL_2$, and $DL_m$ to a pixel and a gate signal transmitted through the scan lines $SL_1$, $SL_2$, and $SL_n$. Each of the transistors TRs and TRd may include a gate electrode, a source electrode, a drain electrode, and a channel region between source and drain regions corresponding to the source and drain electrodes, respectively.

The switching thin film transistor TRs may be connected to the corresponding one of the scan lines $SL_1$, $SL_2$, and $SL_n$, and the driving thin film transistor TRd may be connected to the corresponding one of the data lines $DL_1$, $DL_2$, and $DL_m$. Each of the switching and driving thin film transistors TRs and TRd may include a semiconductor active layer, a gate electrode electrically separated from the semiconductor active layer, and source and drain electrodes connected to the semiconductor active layer.

The scan signal from the scan driver 20 and the data signal from the data driver 30 may be transmitted to each of the pixels PX through the scan lines $SL_1$, $SL_2$, and $SL_n$ and the data lines $DL_1$, $DL_2$, and $DL_m$. In each of the pixels PX, the switching thin film transistor TRs may be configured to control a switching operation of the driving thin film transistor TRd in response to the scan signal and the data signal applied thereto. The driving thin film transistor TRd may be configured to supply a driving electric current, which corresponds to the data signal, to the organic light emitting device OLED. The supplied driving electric current may be used to generate light in the organic light emitting device OLED.

A capacitor C may be provided between the drain electrode of the switching thin film transistor TRs and the gate electrode of the driving thin film transistor TRd. The capacitor C may also be connected between the drain and gate electrodes of the driving thin film transistor TRd. Due to the presence of the capacitor C, the data signal may be applied to the gate electrode of the driving thin film transistor TRd even when the switching thin film transistor TRs is in an off state.

Although not shown in detail, the organic electro luminescence display device may also include at least one thin film transistor and at least one capacitor to improve threshold voltage characteristics of the driving thin film transistor TRd.

Hereinafter, structures of the organic light-emitting display device will be described in detail with reference to FIGS. 2 and 3. Further, a direction oriented from a base substrate toward the driving thin film transistor TRd or the organic light emitting device OLED will be referred to as an "upper direction".

Figure 2:
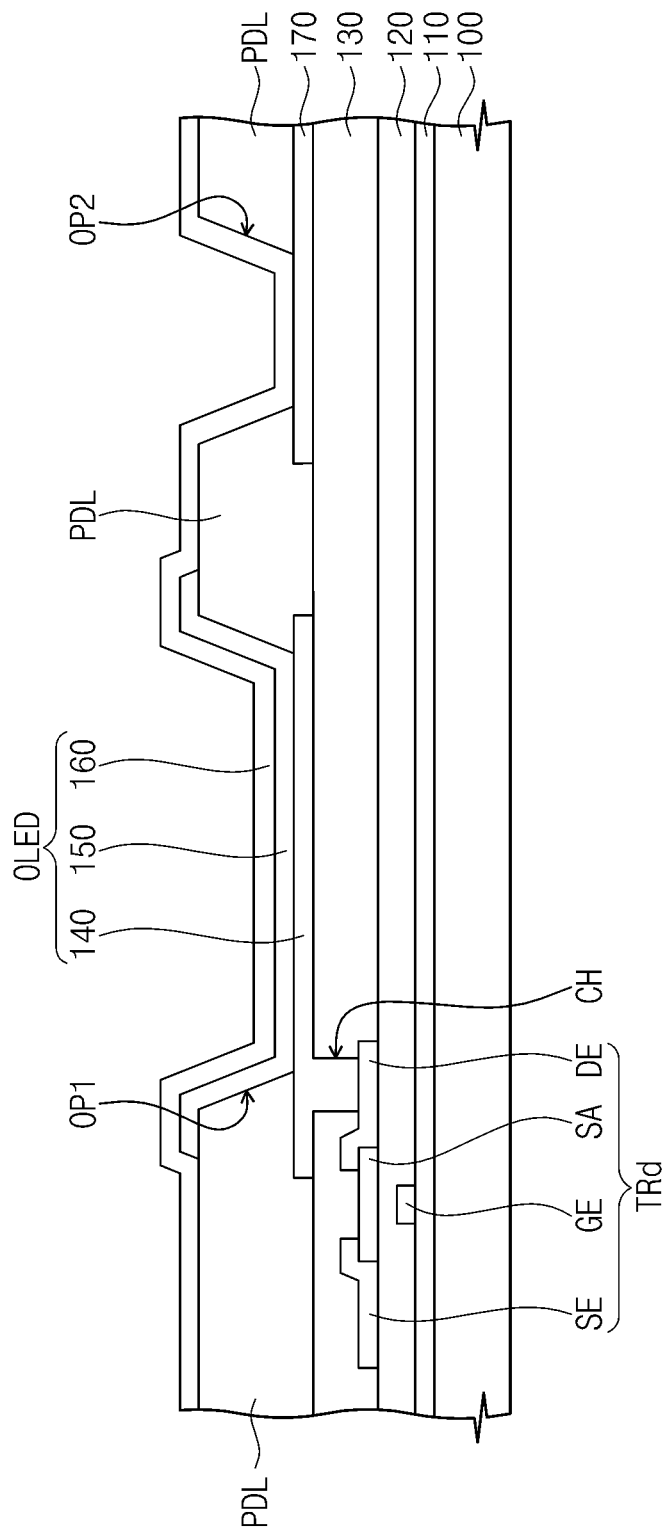
FIG. 2 is a sectional view illustrating a driving thin-film transistor and an organic light-emitting device in one of the pixels of FIG. 1 according to exemplary embodiments of the present disclosure.

FIG. 2 is a sectional view illustrating a driving thin-film transistor TRd and an organic light-emitting device OLED in one of the pixels of FIG. 1. FIG. 3 is a plan view illustrating the auxiliary electrode of FIG. 2.

Figure 3:
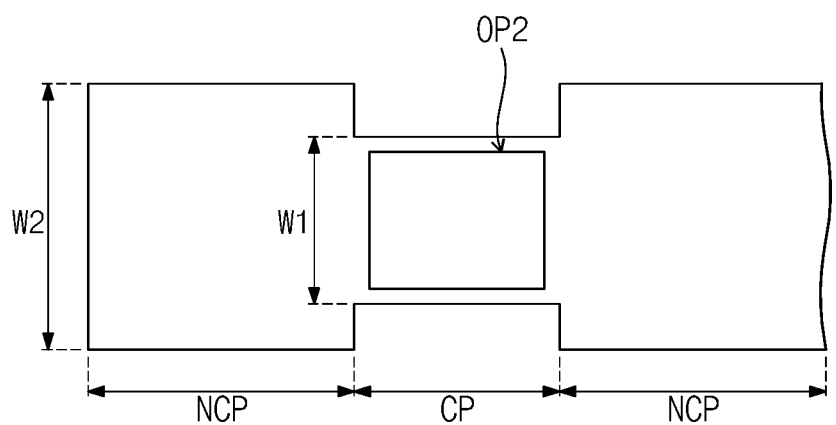
FIG. 3 is a plan view illustrating the auxiliary electrode of FIG. 2 according to exemplary embodiments of the present disclosure.

Referring to FIGS. 2 and 3, an organic light-emitting display device may include the driving thin film transistor TRd, an organic light-emitting device OLED, and an auxiliary electrode 170 disposed on a base substrate 100. The organic light-emitting device OLED may be connected to the driving thin-film transistor TRd.

The base substrate 100 may include a transparent insulating material and be optically transparent. The base substrate may be a rigid-type substrate or a flexible-type substrate. The rigid-type substrate may be one of a glass substrate, a quartz substrate, a glass ceramics substrate, and a crystalline glass substrate. The flexible-type substrate may be one of a film substrate and a plastic substrate including an organic polymer material. The base substrate may be formed of a material that can be prevented from being deteriorated by heat.

The driving thin-film transistor TRd may be disposed on the base substrate 100. The driving thin-film transistor TRd may include a gate electrode GE, a semiconductor active layer SA electrically separated from the gate electrode GE, and source and drain electrodes SE and DE connected to the semiconductor active layer SA.

For example, the gate electrode GE may be provided on the base substrate 100 and may include a conductive material.

A gate insulating layer 120 may be provided on the gate electrode GE and the base substrate 100 to cover the gate electrode GE. The gate insulating layer 120 may be provided to separate the gate electrode GE electrically from the semiconductor active layer SA. The gate insulating layer 120 may include silicon oxide ($SiO_2$) and/or silicon nitride (SiNx).

The semiconductor active layer SA may be provided on the gate insulating layer 120 which may be overlapped with the gate electrode GE. The semiconductor active layer SA may include one of amorphous silicon (a-Si), poly silicon (p-Si), and oxide semiconductors. Further, the semiconductor active layer SA may include a channel region, which may be overlapped with the gate electrode GE, and source and drain regions, which are located at both sides of the channel region and doped with impurities. The oxide semiconductors may contain at least one of Zinc (Zn), Indium (In), Gallium (Ga), Tin (Sn), or mixtures thereof. For example, the oxide semiconductors may include indium-gallium-zinc oxide (IGZO).

Although not shown, if the semiconductor active layer SA includes one of the oxide semiconductors, a light-blocking layer may be provided on or under the oxide semiconductor active layer SA to prevent light from being incident to the oxide semiconductor active layer SA.

The source electrode SE and the drain electrode DE may be connected to the source and drain regions, respectively, of the semiconductor active layer SA. The source electrode SE and the drain electrode DE may include one of copper, copper alloy, aluminum, and aluminum alloy.

In some cases as shown in FIG. 2, the driving thin-film transistor TRd is provided to have a bottom gate structure, but exemplary embodiments of the present disclosure may not be limited thereto. For example, the driving thin-film transistor TRd may be provided to have a top gate structure.

Further, although not shown in FIG. 2, an ohmic contact layer may be provided between the source region and the source electrode SE and between the drain region and the drain electrode DE. The ohmic contact layer may contribute to improve an electric connection property between the source region and the source electrode SE and between the drain region and the drain electrode DE.

In some cases, a buffer layer 110 may be provided between the base substrate 100 and the driving thin-film transistor TRd. The buffer layer 110 may be one of a silicon oxide layer and a silicon nitride layer or may have a multi-layered structure including the silicon oxide layer and the silicon nitride layer. The buffer layer 110 may prevent impurities in the base substrate 100 from being diffused into the driving thin-film transistor TRd and the organic light-emitting device OLED. For example, due to the presence of the buffer layer 110, it is possible to prevent moisture and oxygen from soaking into the driving thin-film transistor TRd and the organic light-emitting device OLED. The buffer layer 110 may be configured to provide a planarized top surface.

A protection layer 130 may be provided on the base substrate 100 with the driving thin-film transistor TRd. For example, the protection layer 130 may be disposed on the driving thin-film transistor TRd. The protection layer 130 may be provided to have a contact hole CH partially exposing the drain electrode DE.

The protection layer 130 may include at least one layer including an inorganic protection layer and an organic protection layer disposed on the inorganic protection layer. The inorganic protection layer may include at least one of silicon oxide and silicon nitride. The organic protection layer may include at least one of acryl, polyimide (PI), polyamide (PA) and benzocyclobutene (BCB). The organic protection layer may be transparent and flexible, and thus, it may serve as a planarization layer reducing unevenness of an underlying structure.

The organic light-emitting device OLED and the auxiliary electrode 170 may be disposed on the protection layer 130. The organic light-emitting device OLED may include the first electrode 140 connected to the drain electrode DE, the organic pattern 150 disposed on the first electrode 140, and the second electrode 160 disposed on the organic pattern 150.

At least one of the first and second electrodes 140 and 160 may be a transmissive electrode. For example, in the case where the organic light emitting display device is a bottom-emission type display device, the first electrode 140 may be a transmissive electrode, while the second electrode 160 may be a reflective electrode. In the case where the organic light emitting display device is a top-emission type display device, the first electrode 140 may be a reflective electrode, while the second electrode 160 may be a transmissive electrode. In the case where the organic light emitting display device is a dual emission type display device, both of the first electrode 140 and the second electrode 160 may be transmissive electrodes.

One of the first electrode 140 and the second electrode 160 may be an anode electrode, and the other a cathode electrode.

The description that follows will refer to exemplary embodiments of the present disclosure in which the first electrode 140 and the second electrode 160 are used as a transparent anode electrode and a reflective cathode electrode, respectively.

The first electrode 140 may be disposed on the protection layer 130 and be connected to the drain electrode DE through the contact hole CH. The first electrode 140 may include a transparent conductive oxide having a work-function higher than that of the second electrode 160. For example, the first electrode 140 may include one of indium tin oxide (ITO), indium zinc oxide (IZO), aluminum zinc Oxide (AZO), gallium doped zinc oxide (GZO), zinc tin oxide (ZTO), gallium tin oxide (GTO), and fluorine doped tin oxide (FTO).

The first electrode 140 may be partially exposed by a first opening OP1 of a pixel-defining layer PDL. The pixel-defining layer PDL may include an organic insulating material. For example, the pixel-defining layer PDL may include at least one of polystyrene, poly methyl methacrylate (PMMA), polyacrylonitrile (PAN), polyamide, polyimide, polyarylether, heterocyclic polymer, parylene, fluorine series polymer, epoxy resin, benzocyclobutene series resin, siloxane series resin, or silane.

The second electrode 160 may include at least one of materials (e.g., Molybdenum (Mo), Tungsten (W), Silver (Ag), Magnesium (Mg), Aluminum (Al), Platinum (Pt), Palladium (Pd), Gold (Au), Nickel (Ni), Neodymium (Nd), Iridium (Ir), Chromium (Cr), Lithium (Li), Calcium (Ca), and alloys thereof), having a work-function that is smaller than the first electrode 140. In addition, the auxiliary electrode 170 may be disposed on the protection layer 130 and connected to the second electrode 160 to prevent a voltage drop problem of the second electrode 160 from occurring.

The organic layer 150 may be disposed on the first electrode 140 exposed by the pixel-defining layer PDL. The organic layer 150 may include at least one emitting layer EML and, in general, may have a multi-layered structure. For example, the organic layer 150 may include a hole injection layer HIL, a hole transport layer HTL, the emitting layer EML, a hole blocking layer HBL, an electron transport layer ETL, and an electron injection layer EIL. The hole transport layer HTL may have high hole mobility and be configured to suppress movement of electrons that are not combined in the emitting layer EML, thereby increasing probability of recombination between holes and electrons. In the emitting layer EML, the injected electrons and holes may be re-combined with each other to emit light. The hole blocking layer HBL may be configured to suppress holes, which are not combined with electrons in the emitting layer EML, from moving. The electron transport layer ETL may be configured to move electrons to the emitting layer EML efficiently. The emitting layer of the organic layer 150 may be configured to emit/pass one of red, green, blue and white lights, but exemplary embodiments of the present disclosure may not be limited thereto. For example, the emitting layer of the organic layer 150 may be configured to emit/pass one of magenta, cyan, and yellow lights.

The organic layer 150 may not be provided between the auxiliary electrode 170 and the second electrode 160, and this makes it possible to improve an electric connection property between the auxiliary electrode 170 and the second electrode 160. The auxiliary electrode 170 may be connected to the second electrode 160, thereby preventing a voltage drop from occurring in the second electrode 160.

The auxiliary electrode 170 may be provided on the protection layer 130 to be spaced apart from the first electrode 140, and the auxiliary electrode 170 may include the same material as the first electrode 140. A portion of the auxiliary electrode 170 may be exposed by a second opening OP2 of the pixel defining layer PDL.

The auxiliary electrode 170 may include a connection part CP and at least one non-connection part NCP. The connection part CP may refer to a region in contact with the second electrode 160, and the non-connection part NCP may refer to a region that is not in contact with the second electrode 160.

In addition, when measured in the direction perpendicular to a current flow, a width W1 of the connection part CP may be less than a width W2 of the non-connection part NCP.

FIGS. 4, 5, 6, 7, and 8 are sectional views illustrating a method of fabricating the organic light-emitting display device of FIGS. 1, 2, and 3.

Figure 4:
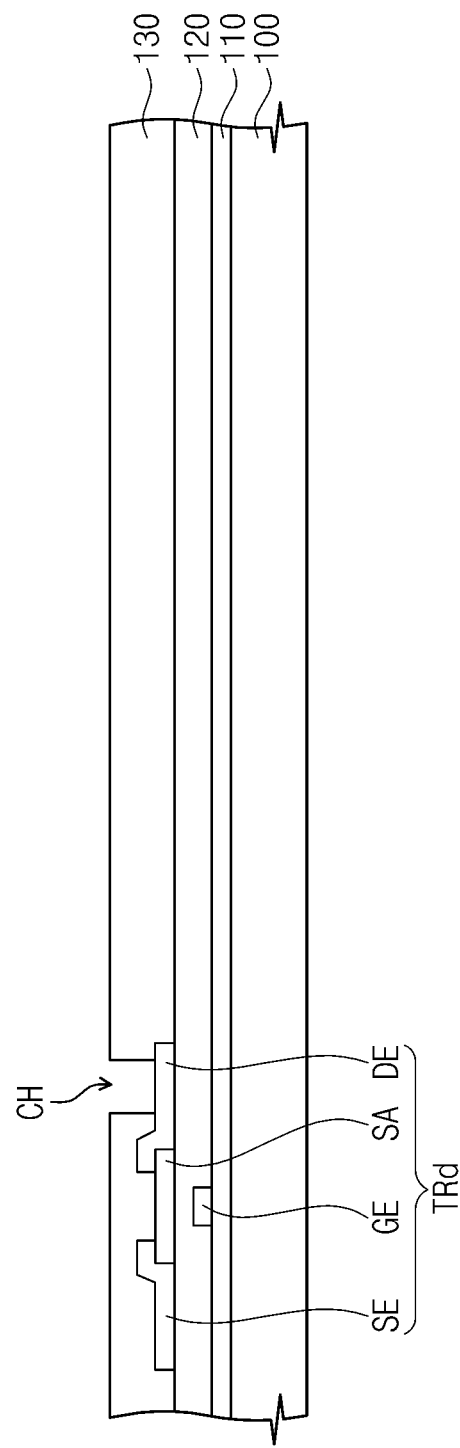
FIGS. 4, 5, 6, 7, and 8 are sectional views illustrating a method of fabricating the organic light-emitting display device of FIGS. 1, 2, and 3 according to exemplary embodiments of the present disclosure.

Referring to FIG. 4, the buffer layer 110 may be formed on the base substrate 100. The buffer layer 110 may be one of a silicon oxide layer and a silicon nitride layer, or may have a multi-layered structure including the silicon oxide layer and the silicon nitride layer. The buffer layer 110 may prevent impurities in the base substrate 100 from being diffused upward. For example, due to the presence of the buffer layer 110, it is possible to prevent moisture and oxygen from soaking into a structure to be provided on the base substrate 100. The buffer layer 110 may be formed to provide a planarized top surface.

After the formation of the buffer layer 110, the driving thin-film transistor TRd may be formed on the buffer layer 110. For example, the driving thin-film transistor TRd may include the gate electrode GE, the semiconductor active layer SA electrically separated from the gate electrode GE, and the source and drain electrodes SE and DE connected to the semiconductor active layer SA.

According to exemplary embodiments of the present disclosure, the driving thin-film transistor TRd may be formed by performing steps to be described below.

Firstly, a gate conductive layer (not shown) may be formed on the buffer layer 110 and may be patterned to form the gate electrode GE.

After the formation of the gate electrode GE, the gate insulating layer 120 may be formed to cover the gate electrode GE. The gate insulating layer 120 may include at least one of silicon oxide ($SiO_2$) or silicon nitride (SiNx).

After the formation of the gate insulating layer 120, the semiconductor active layer SA may be formed on the gate insulating layer 120 to be partially overlapped with the gate electrode GE. The formation of the semiconductor active layer SA may include forming a semiconductor layer (not shown) on the gate insulating layer 120 and then pattering the semiconductor layer.

The semiconductor active layer SA may include one of amorphous silicon (a-Si), poly silicon (p-Si), and oxide semiconductors. Further, the semiconductor active layer SA may include the channel region, which is overlapped with the gate electrode GE, and the source and drain regions, which are located at both sides of the channel region and doped with impurities. According to exemplary embodiments of present disclosure, the oxide semiconductors may contain at least one of Zinc (Zn), Indium (In), Gallium (Ga), Tin (Sn), or mixtures thereof. For example, the oxide semiconductors may include indium-gallium-zinc oxide (IGZO).

After the formation of the semiconductor active layer SA, the source electrode SE and the drain electrode DE may be formed to be connected to the source region and the drain region, respectively. The formation of the source and drain electrodes SE and DE may include forming a data conductive layer (not shown) to cover the semiconductor active layer SA and the gate insulating layer 120, and then, patterning the data conductive layer. According to exemplary embodiments of present disclosure, the source electrode SE and drain electrode DE may be formed to be spaced apart from each other.

The data conductive layer may include one of copper, copper alloy, aluminum, and aluminum alloy.

Further, although not shown, an ohmic contact layer may be provided between the source region and the source electrode SE and between the drain region and the drain electrode DE. The ohmic contact layer may contribute to improve an electric connection property between the source region and the source electrode SE and between the drain region and the drain electrode DE.

After the formation of the source electrode SE and the drain electrode DE, the protection layer 130 may be formed to cover the resulting structure with the driving thin-film transistor TRd. The protection layer 130 may include at least one layer. For example, the protection layer 130 may include an inorganic protection layer and an organic protection layer disposed on the inorganic protection layer. The inorganic protection layer may include at least one of silicon oxide and silicon nitride. Further, the organic protection layer may include at least one of acryl, polyimide (PI), polyamide (PA), and benzocyclobutene (BCB). According to exemplary embodiments of present disclosure, the organic protection layer may be transparent and flexible, and thus, it may serve as a planarization layer reducing unevenness of an underlying structure.

Figure 5:
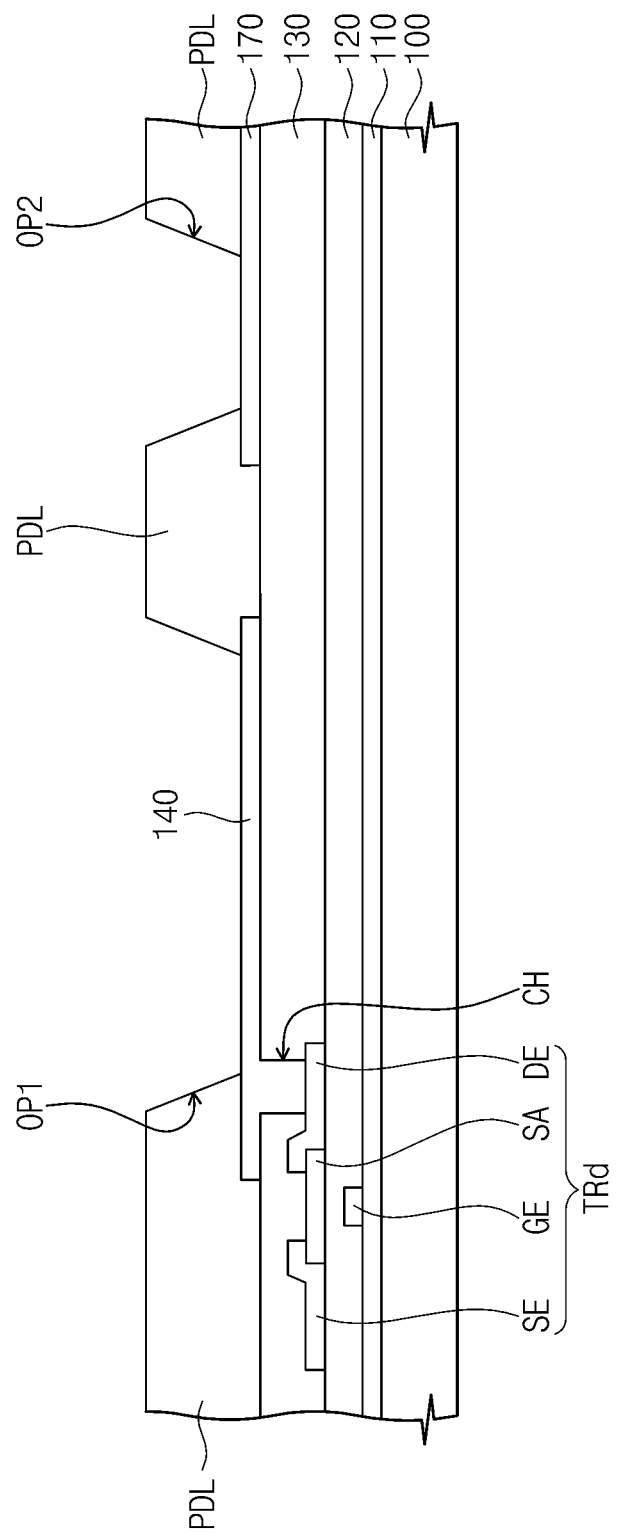

Referring to FIGS. 4 and 5, after the formation of the protection layer 130, the protection layer 130 may be patterned to form the contact hole CH partially exposing the drain electrode DE.

After the formation of the contact hole CH, a transparent conductive layer (for example, including a transparent conductive oxide) may be formed on the protection layer 130 and then patterned to form the first electrode 140 and the auxiliary electrode 170 that are spaced apart from each other. The first electrode 140 may be connected to the drain electrode DE via the contact hole CH. The auxiliary electrode 170 may include the connection part CP and the non-connection part NCP. The connection part CP may refer to a region in contact with the second electrode 160, and the non-connection part NCP may refer to a region not in contact with the second electrode 160. In addition, when measured in the direction perpendicular to a current flow, the auxiliary electrode 170 may be formed in such a way that a width of the connection part CP is less than that of the non-connection part NCP.

The first electrode 140 and the auxiliary electrode 170 may include a transparent conductive oxide, having a work-function that is higher than a work-function of the second electrode 160. For example, the first electrode 140 may include one of indium tin oxide (ITO), indium zinc oxide (IZO), aluminum zinc Oxide (AZO), gallium doped zinc oxide (GZO), zinc tin oxide (ZTO), gallium tin oxide (GTO), and fluorine doped tin oxide (FTO).

After the formation of the first electrode 140 and the auxiliary electrode 170, the pixel defining layer PDL may be formed to include the first opening OP1 partially exposing the first electrode 140 and the second opening OP2 partially exposing the auxiliary electrode 170.

The pixel defining layer PDL may include an insulating organic material. For example, the pixel-defining layer PDL may include at least one of polystylene, poly methyl methacrylate (PMMA), polyacrylonitrile (PAN), polyamide, polyimide, polyarylether, heterocyclic polymer, parylene, fluorine series polymer, epoxy resin, benzocyclobutene series resin, siloxane series resin, or silane resin.

Figure 6:
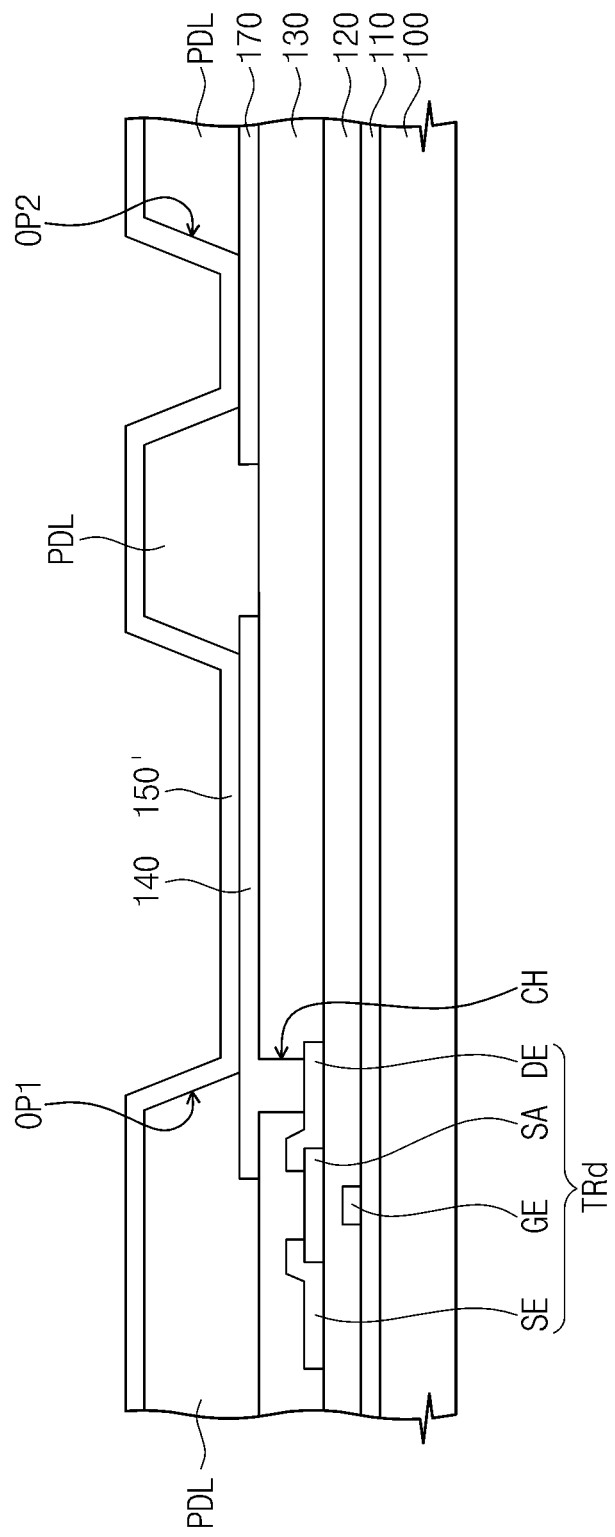

Referring to FIG. 6, after the formation of the pixel defining layer PDL, an organic layer 150' may be formed on the pixel defining layer PDL. The organic layer 150' may be provided on the pixel defining layer PDL, the first electrode 140, and the auxiliary electrode 170.

The organic layer 150' may include at least the emitting layer EML and, in general, may have a multi-layered structure. For example, the organic layer 150' may include the hole injection layer HIL, the hole transport layer HTL, the emitting layer EML, the hole blocking layer HBL, the electron transport layer ETL, and the electron injection layer EIL. The hole transport layer HTL may have a high hole mobility and be configured to suppress movement of electrons that are not combined in the emitting layer EML, thereby increasing probability of recombination between holes and electrons. In the emitting layer EML, the injected electrons and holes may be re-combined with each other to emit light. The hole blocking layer HBL may be configured to suppress holes, which are not combined with electrons in the emitting layer EML, from moving. The electron transport layer ETL may be configured to move electrons to the emitting layer EML efficiently.

Figure 7:
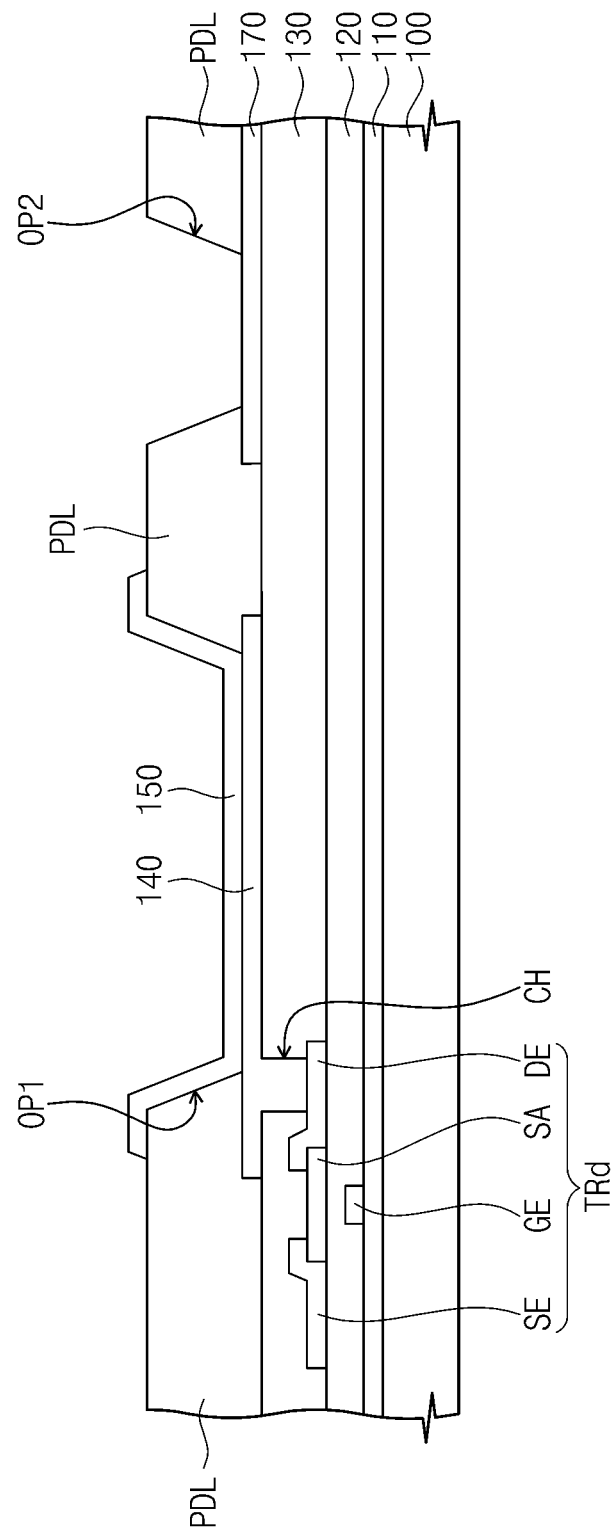

Referring to FIG. 7, after the formation of the organic layer 150', the organic layer 150' may be patterned to remove a portion of the organic layer 150' from a region adjacent to the connection part CP, thereby forming the organic pattern 150.

For example, after the formation of the organic layer 150', an electric power may be applied to the auxiliary electrode 170 to produce heat from the connection part CP. Since the width of the connection part CP is less than that of the non-connection part NCP, the heat may be locally produced from the connection part CP. According to exemplary embodiments of present disclosure, the electric power may be applied in such a way that a portion of the organic layer 150' adjacent to the connection part CP can be evaporated or sublimed by the heat. Accordingly, the organic layer 150' may be patterned to form the organic pattern 150.

Figure 8:
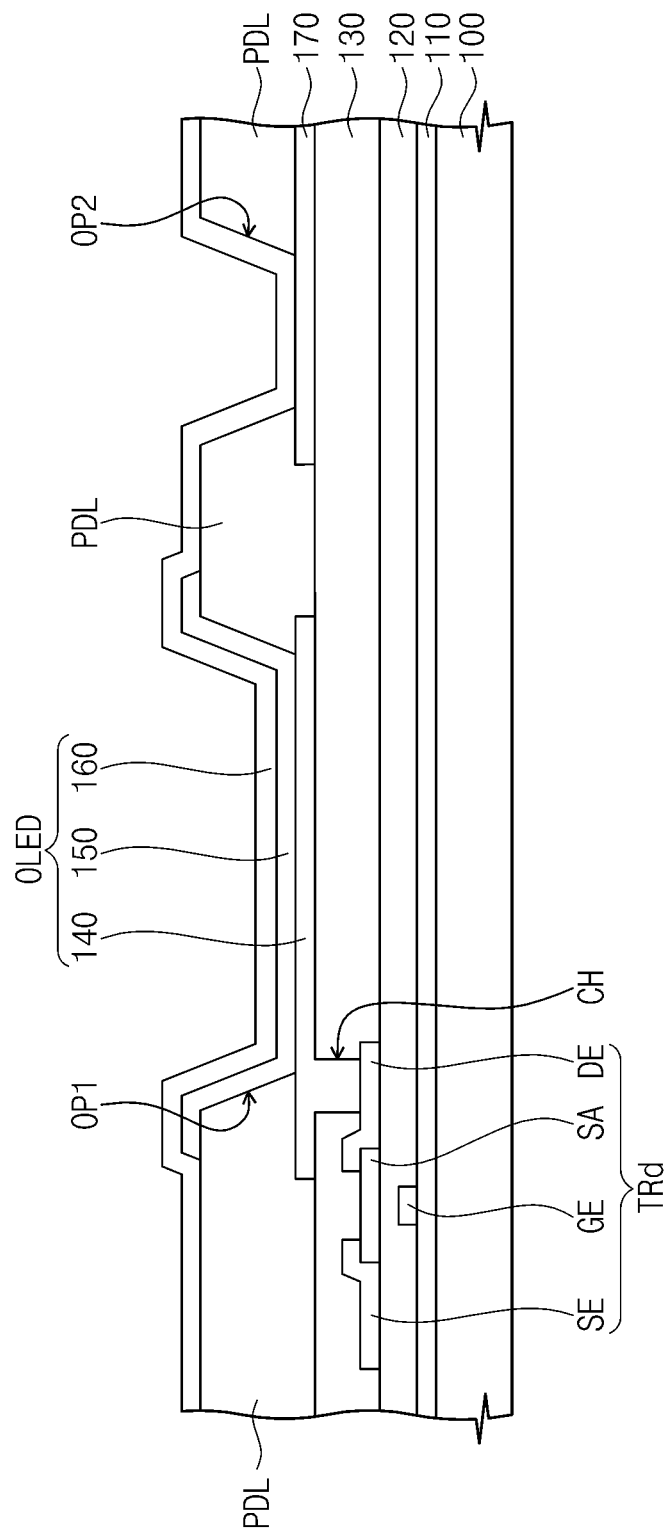

Referring to FIG. 8, after the formation of the organic pattern 150, the second electrode 160 may be formed on the organic pattern 150. The second electrode 160 may be partially connected to the connection part CP. According to exemplary embodiments of present disclosure, the organic layer 150' may not be provided between the second electrode 160 and the connection part CP, and thus, it is possible to improve an electric connection property between the second electrode 160 and the connection part CP.

In addition, the second electrode 160 may include at least one of materials (e.g., Mo, W, Ag, Mg, Al, Pt, Pd, Au, Ni, Nd, Ir, Cr, Li, Ca, and alloys thereof), whose work-function is smaller than the first electrode 140.

After the formation of the second electrode 160, an encapsulating process may be further performed to fabricate the organic light-emitting display device.

Exemplary embodiments of the present disclosure are also described with reference to FIG. 9. For concise description, a previously described element may be identified by a similar or identical reference number without repeating a description thereof.

Figure 9:
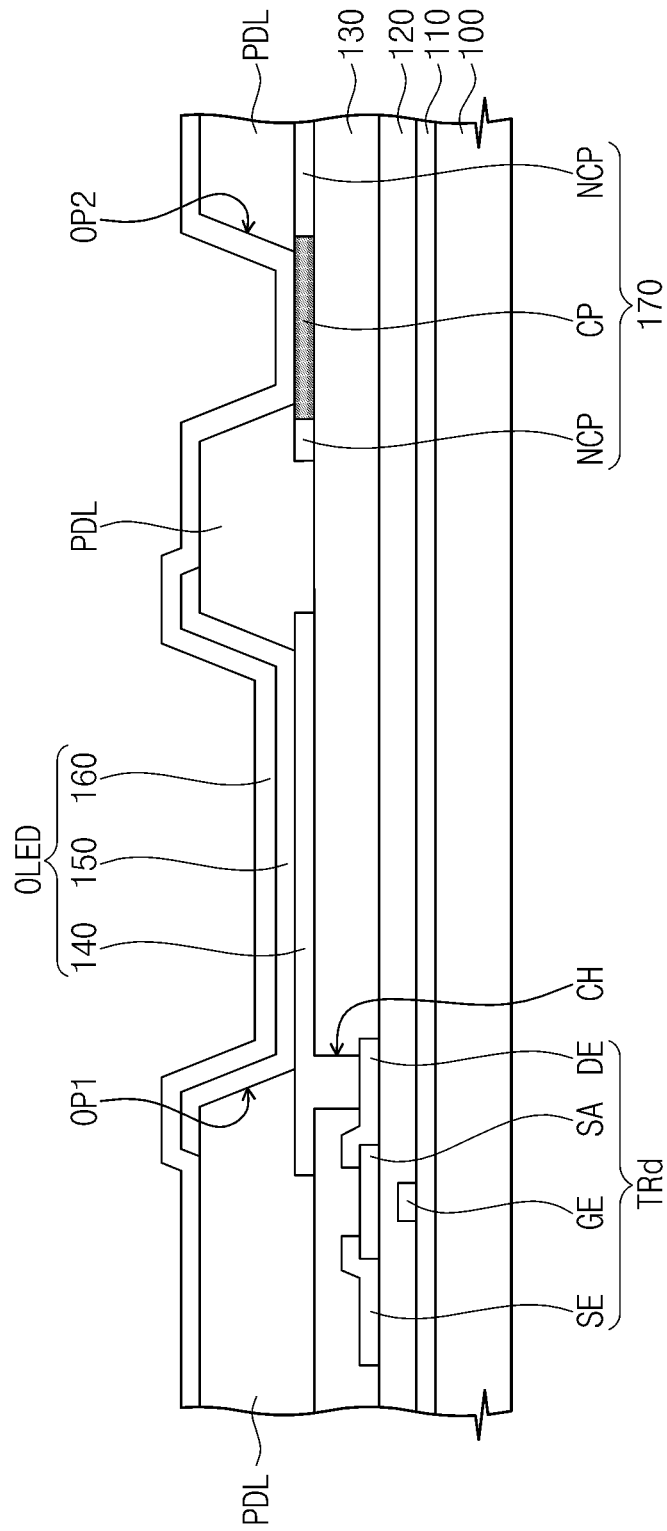
FIG. 9 is a sectional view illustrating an organic light-emitting display device according to exemplary embodiments of the present disclosure.

FIG. 9 is a sectional view illustrating an organic light-emitting display device according to other exemplary embodiments of the present disclosure.

Referring to FIG. 9, an organic light-emitting display device may include the driving thin-film transistor TRd and the organic light-emitting device OLED disposed on the base substrate 100. The organic light-emitting device OLED may be connected to the driving thin-film transistor TRd.

The driving thin-film transistor TRd may be disposed over the base substrate 100. The driving thin-film transistor TRd may include the gate electrode GE, the semiconductor active layer SA electrically separated from the gate electrode GE, and the source and drain electrodes SE and DE connected to the semiconductor active layer SA.

The protection layer 130 may be provided on the resulting structure with the driving thin-film transistor TRd. For example, the protection layer 130 may be formed to cover the driving thin-film transistor TRd and may have a contact hole CH partially exposing the drain electrode DE.

The organic light-emitting device OLED and the auxiliary electrode 170 may be provided on the protection layer 130.

The organic light-emitting device OLED may include the first electrode 140 connected to the drain electrode DE, the organic pattern 150 disposed on the first electrode 140, and the second electrode 160 disposed on the organic pattern 150.

The auxiliary electrode 170 may be provided at the same layer as the first electrode 140. For example, the auxiliary electrode 170 may be provided on the protection layer 130 to be spaced apart from the first electrode 140. The auxiliary electrode 170 may be partially exposed by the second opening OP2 of the pixel defining layer PDL.

The auxiliary electrode 170 may include the connection part CP and the non-connection part NCP. The connection part CP may refer to a region in contact with the second electrode 160, and the non-connection part NCP may refer to a region not in contact with the second electrode 160. In some cases, the connection part CP and the non-connection part NCP may have different resistances from each other. For example, the connection part CP may have a resistance higher than that of the non-connection part NCP.

The organic material 150 may not be provided between an auxiliary electrode 170 and a second electrode 160 thereby improving an electric connection property between the auxiliary electrode 170 and the second electrode 160. Accordingly, it is possible to prevent a voltage drop from occurring in the second electrode 160.

In some cases, the formation of the organic light-emitting display device may include generating heat from the auxiliary electrode 170 to remove an organic material formed on the auxiliary electrode 170. For example, electric power may be applied to the auxiliary electrode to produce heat in the connection part CP of the auxiliary electrode 170. Organic material of the organic layer 150 may be removed from the connection part CP due to the heat. Accordingly, it is possible to omit an additional step of removing the organic material.

It will be apparent to those skilled in the art that various modifications and variation can be made in the present disclosure without departing from the spirit or scope of the disclosed subject matter. Thus, it is intended that the present disclosure cover the modifications and variations of the disclosed subject matter provided they come within the scope of the appended claims and their equivalents.

What is claimed is:

1. An organic light-emitting display device, comprising:
   a base substrate;
   a thin-film transistor disposed on the base substrate;
   an organic light-emitting device comprising a first electrode connected to the thin-film transistor, an organic pattern disposed on the first electrode, and a second electrode disposed on the organic pattern; and
   an auxiliary electrode comprising a connection part and a non-connection part, the connection part being coupled to the second electrode, the connection part and the non-connection part of the auxiliary electrode being arranged along a lengthwise direction,
   wherein a width of the connection part along a widthwise direction perpendicular to the lengthwise direction is less than a width of the non-connection part along the widthwise direction.

2. The device of claim 1, wherein the auxiliary electrode is disposed on the same layer as the first electrode.

3. The device of claim 2, wherein the auxiliary electrode comprises the same material as the first electrode.

4. The device of claim 1, wherein the width of the connection part is less than the width of the non-connection part when measured in a direction perpendicular to a current flow.

5. An organic light-emitting display device, comprising:
   a base substrate;
   a thin-film transistor disposed on the base substrate;
   an organic light-emitting device comprising a first electrode connected to the thin-film transistor, an organic pattern disposed on the first electrode, and a second electrode disposed on the organic pattern; and
   an auxiliary electrode comprising a connection part and a non-connection part, the connection part being coupled to the second electrode, the connection part and the non-connection part of the auxiliary electrode being arranged along a lengthwise direction perpendicular to a widthwise direction,
   wherein the connection part and the non-connection part have different resistances from each other, and the connection part does not overlap with the first electrode.

6. The device of claim 5, wherein a resistance of the connection part is greater than a resistance of the non-connection part.

7. The device of claim 6, wherein the auxiliary electrode is disposed on the same layer as the first electrode.

8. The device of claim 5, wherein the organic pattern directly contacts the first electrode and is not in contact with the auxiliary electrode.

9. The device of claim 5, further comprising a pixel defining layer, the pixel defining layer comprising a first opening and a second opening,
- wherein the organic pattern and the second electrode are disposed in the first opening, and
- wherein the second electrode is disposed in the second opening.

10. The device of claim 9, wherein the organic pattern directly contacts the first electrode in the first opening, and the second electrode directly contacts the auxiliary electrode in the second opening.

11. The device of claim 5, wherein the first electrode directly contacts a drain electrode of the thin-film transistor.

12. The device of claim 5, wherein the connection part is connected to the non-connection part without a step at the connection part along a direction perpendicular to the lengthwise direction and the widthwise direction.

13. The device of claim 1, wherein the connection part is connected to the non-connection part without a step at the connection part along a direction perpendicular to the lengthwise direction and the widthwise direction.

* * * * *